US010153657B1

(12) United States Patent
Koifman

(10) Patent No.: US 10,153,657 B1
(45) Date of Patent: Dec. 11, 2018

(54) RETROFIT WIRELESS SOLAR CHARGER APPARATUS AND METHODS

(71) Applicant: David Koifman, Tel Aviv (IL)

(72) Inventor: David Koifman, Tel Aviv (IL)

( * ) Notice: Subject to any disclaimer, the term of this patent is extended or adjusted under 35 U.S.C. 154(b) by 0 days.

(21) Appl. No.: 15/913,962

(22) Filed: Mar. 7, 2018

(51) Int. Cl.
| | |
|---|---|
| *H02J 7/35* | (2006.01) |
| *H02J 7/02* | (2016.01) |
| *H02S 40/38* | (2014.01) |
| *H02J 50/10* | (2016.01) |
| *H02J 50/90* | (2016.01) |
| *H02S 10/40* | (2014.01) |
| *H05K 1/18* | (2006.01) |
| *H02J 7/00* | (2006.01) |
| *H04B 5/00* | (2006.01) |
| *H04W 4/80* | (2018.01) |

(52) U.S. Cl.
CPC ............ *H02J 7/355* (2013.01); *H02J 7/0047* (2013.01); *H02J 7/0054* (2013.01); *H02J 7/025* (2013.01); *H02J 50/10* (2016.02); *H02J 50/90* (2016.02); *H02S 10/40* (2014.12); *H02S 40/38* (2014.12); *H05K 1/181* (2013.01); *H04B 5/0037* (2013.01); *H04W 4/80* (2018.02)

(58) Field of Classification Search
CPC ............................... H02J 7/025; H02J 7/0054
USPC .................................................. 320/101, 103
See application file for complete search history.

(56) References Cited

U.S. PATENT DOCUMENTS

| | | | |
|---|---|---|---|
| 9,209,324 B2 | 12/2015 | Markku | |
| 9,287,427 B2 * | 3/2016 | Naskali | .................... H02J 7/025 |
| 9,698,623 B2 * | 7/2017 | Adams | ..................... H02J 7/355 |
| 2009/0179610 A1 * | 7/2009 | Lin | ......................... H02J 7/0054 |
| | | | 320/101 |
| 2011/0050164 A1 * | 3/2011 | Partovi | .................... H01F 5/003 |
| | | | 320/108 |
| 2011/0117974 A1 | 5/2011 | Sptalnik et al. | |
| 2015/0221785 A1 | 8/2015 | Cheng | |
| 2015/0359127 A1 * | 12/2015 | Daoura | .................. G06Q 10/00 |
| | | | 320/101 |
| 2016/0062319 A1 * | 3/2016 | Kim | ....................... G04C 10/00 |
| | | | 368/204 |
| 2016/0104151 A1 * | 4/2016 | Tunnell | ................. H02J 7/0042 |
| | | | 705/41 |

(Continued)

FOREIGN PATENT DOCUMENTS

CN         203219353        9/2015

*Primary Examiner* — Samuel Berhanu
*Assistant Examiner* — Tessema Kebede
(74) *Attorney, Agent, or Firm* — Haim M. Factor, 1st-Tech-Ideas

(57) ABSTRACT

A retrofit wireless solar charger apparatus for a mobile device, the charger apparatus having an enclosure enclosing: a photovoltaic (PV) array having an efficiency of at least 22 percent, the PV array exposed to ambient light; a battery in electrical contact with the PV array; an RF power transfer coil in electrical contact with the battery; a printed circuit board (PCB) having a front side and a back side, the PCB having surface-mounted components mounted on the front side and the PCB being in electrical contact with the PV array, the battery, and the RF transfer coil; and a two-sided adhesive layer, the two-sided adhesive layer adhered to the back side of the PCB; wherein the charger apparatus has a thickness ranging from 1 to 3 mm and the charger apparatus is retrofittably-adhered on-board the mobile device.

11 Claims, 13 Drawing Sheets

(56) References Cited

U.S. PATENT DOCUMENTS

Figure 1A:
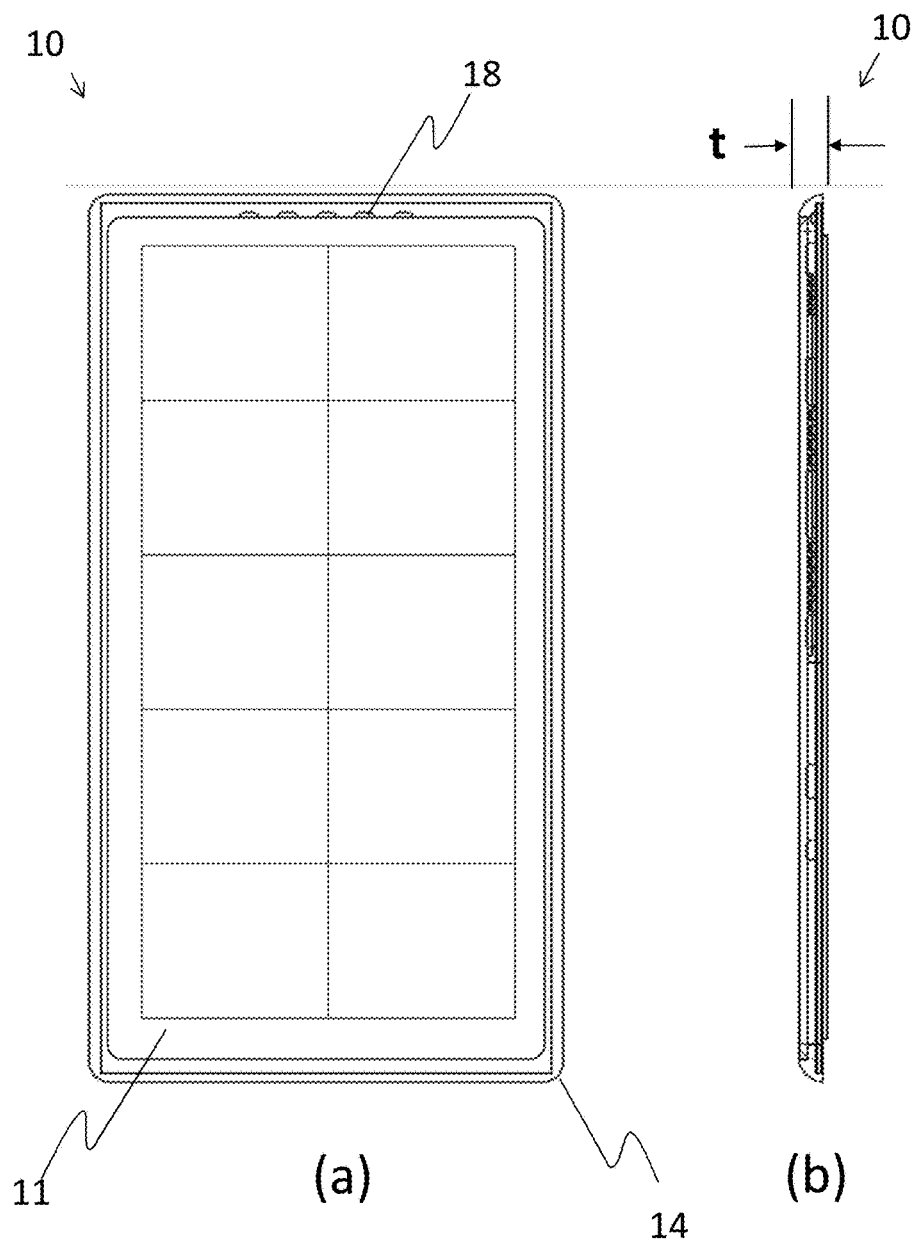

| | | |
|---|---|---|
| 2016/0218553 A1* | 7/2016 | He .................. H02J 7/0036 |
| 2017/0047785 A1 | 2/2017 | Twelker et al. |
| 2017/0162735 A1 | 6/2017 | Hsu et al. |
| 2017/0187233 A1 | 6/2017 | Wilkinson |

* cited by examiner

RETROFIT WIRELESS SOLAR CHARGER APPARATUS AND METHODS

FIELD OF THE INVENTION AND BACKGROUND

The current invention relates to a mobile device having rechargeable batteries, and specifically to a retrofit wireless solar charger apparatus and methods to significantly reduce the need for battery recharging using an off-board charger.

In the specification and claims which follow hereinbelow, the term "mobile device" is intended to mean any one of an array of electronic devices such as but not limited to: a smartphone, a tablet, a personal computer, and a smart watch—all having at least one rechargeable battery, and all which currently need recharging using a dedicated off-board charger. In the specification and claims which follow, the term "off-board charger" is intended to mean primarily a "mains charger" or any similar "battery recharger"; "charger", and "recharger" that is typically maintained separately from the mobile device and is used to periodically recharge one or more batteries of a mobile device.

Most people nowadays use one or more mobile devices every day. Mobile devices are designed to be relatively lightweight, having batteries with sufficient capacity to power the device for a number of hours with relatively heavy use and perhaps for no more than a few days in passive/standby mode. For example, most smartphones today have battery capacity generally ranging from about 2,500 to 3,500 mAh; most smart watches have battery capacities ranging 250 to 400 mAh. Other mobile devices have similar battery capacity, scaled to their respective device size and power usage.

In virtually all cases, mobile devices today must be recharged relatively frequently, and the need for them to be periodically connected to a nominal 5 VDC USB power source and/or to have an off-board charger nearby/at hand is universal and well understood. The most common way of recharging mobile devices today is by using a mains charger (ie, 220/110 VAC input, providing typical/nominal 5 VDC output or equivalent, as known in the art). Such chargers are connected to the device-to-be-charged by wired means (typically a USB cable) or by wireless means, as is common with more modern smartphones, as known in the art.

Another way to charge a mobile device is to connect a USB cord to a 5 VDC power source wall socket, such as is that available in some homes and public places, such as but not limited to: airports, airplanes, and buses. Use of a socket, while convenient when available, is generally not a good substitute to having an off-board charger at hand.

Another way of charging a mobile device is by using a back-up battery, which is charged in advance, typically using an off-board charger. The use of a back-up battery, while allowing a user to extend the charge time of his mobile device, nonetheless does not obviate the need for an off-board charger, as eventually the back-up battery (as well as the mobile device itself) must be recharged.

In summary, there is a universal need to have an off-board charger available virtually whenever a mobile device is used. What if there were no need to be constantly concerned with the need to recharge a mobile device and/or if charging could be performed "on board"—as opposed to off-board?

Prior art addresses the aforementioned problem of recharging by utilizing photovoltaic (PV) cell technology to generate electricity to (partially) recharge a mobile device. A number of prior art address the problem, as indicated hereinbelow.

In US Patent application publication no. 2015221785, whose disclosure is incorporated by reference, Cheng describes a solar module, which includes a solar panel and a wireless power transmission module coupled to the solar panel for transmitting power generated by the solar panel wirelessly.

Michael et al., in U.S. Pat. No. 9,698,623, whose disclosure is incorporated by reference, describe an integrated mobile phone case and charger for providing both a protective casing for a mobile device which includes an integrated solar cell for charging the battery of the mobile device therein comprises a case body defined by a front piece and a back piece, with the back piece including solar cells, electrical wiring, and a charging port. The front piece and back piece are configured to releasable attached to each other to form an enclosure in which a mobile phone or other mobile device is placed and secured. The solar cells electricity to be generated to be supplied to the battery of a mobile device disposed in the integrated mobile phone case and charger. A thermoelectric cooler and an electronics control unit may additionally be included in the case body to enable selective charging and cooling of a mobile device with the generated electricity.

In China Patent publication no. CN203219353 whose disclosure is incorporated by reference, Wang Desheng describes an embodiment of the utility model providing a cell phone. The cell phone comprises a cell phone body, an electromagnetic transmitter, and a solar cell panel. The cell phone comprises an electromagnetic receiver and a battery. The solar cell panel installed on the electromagnetic transmitter is used for absorbing solar energy and converting the solar energy to electric energy to supply the electromagnetic transmitter with power. The electromagnetic transmitter is used for converting the electric energy provided by the solar cell panel to magnetic energy and transmitting electromagnetic waves with continuously-changing frequencies. The electromagnetic receiver generates induced electromotive forces according to changes of the magnetic flux of the surrounding magnetic field, produces electric energy, and supplies the battery with power. The cell phone provided by the utility model is simple in structure and convenient in operation. Users can charge the cell phone wirelessly. The cell phone makes full utilization of solar energy, saves energy and reduces emission.

Naskali Matti Juhani et al. describe, in U.S. Pat. No. 9,287,427, whose disclosure is incorporated by reference, describe an apparatus comprising a solar cell arrangement comprising one or more solar cells arranged in a planar structure, the solar cell arrangement having a front surface and a rear surface, the solar cell arrangement being operable to produce electrical power in response to the incidence of light on the front surface. It includes an induction loop arrangement comprising one or more induction loops arranged in a planar structure. The induction loop arrangement is configured to produce electrical power in response to the presence of an electric or electromagnetic field extending through the plane of the induction loop arrangement, and/or is configured to generate an [sic] radiate electric or electromagnetic field through the plane of induction loop arrangement in response to being energized with alternating current electrical power. Each solar cell in the arrangement is partly or substantially transparent to electromagnetic fields, and the induction loop arrangement is supported in juxtaposition with the rear surface of the solar cell.

In U.S. Pat. No. 9,209,324, whose disclosure is incorporated by reference, Rouvala describes an apparatus comprising a photovoltaic cell arrangement having a front surface and a rear surface, and first and second conductor patterns formed on different ones of the front and rear surfaces. The first conductor pattern comprises at least one loop, and the apparatus comprises at least a first terminal connected to the second conductor pattern, and second and third terminals connected to different ends of the at least one loop of the first conductor pattern. A transducer arrangement comprises a transducer body having a front surface and a rear surface, and first and second conductor patterns formed on different ones of the front and rear surfaces. The first conductor pattern comprises at least one loop. The transducer arrangement comprises at least a first terminal connected to the second conductor pattern, and second and third terminals connected to different ends of the at least one spiral loop of the first conductor pattern. The transducer body and the first and second conductor patterns together form a photovoltaic transducer arrangement and the second conductor pattern constitutes an induction transducer.

Christopher, in US Patent Application Publication no. 2017187233, whose disclosure is incorporated by reference, describes a system for recharging a battery having; memory that stores computer-executable instructions; a processor, communicatively coupled to the memory that facilitates execution of the computer-executable instructions; the instructions having: a battery; a thermal insulating layer; the thermal insulating layer; adapted and configured as the exterior of the battery; the battery adapted and configured with the thermal insulation layer for harnessing heat created by a plurality of solar panels; the plurality of solar panels configured on the exterior of the battery; an application interface unit; the application interface unit adapted and configured to control the plurality of solar panels; wherein the processor transforms heat energy collected by the plurality of solar panels and stored in the thermal insulation layer into energy to power a communication device.

In US Patent Application Publication no. 2017047785, whose disclosure is incorporated by reference, Twelker et al. describe mobile electronic devices configured to be wirelessly charged, the devices featuring a receiver resonator configured to capture oscillating magnetic flux, the receiver resonator including: a conductive material layer defining an aperture and a slit extending from the aperture to an outer edge of the conductive material layer, where the conductive material layer forms a back cover of the mobile electronic device, and an inductor having first and second conductor traces, the first trace coupled to a first portion of the conductive material layer adjacent to a first side of the slit and the second trace coupled to a second portion of the conductive material layer adjacent to a second side of the slit.

Landon et al., in US Patent Application publication no. 2011117974, whose disclosure is incorporated by reference, describe examples of the present invention being directed toward systems and methods of providing additional functionality to a portable electro device. Examples of such systems include a terminal adapter having a first portion constructed and arranged to connect to the portable electronic device by insertion between a terminal of a battery of the portable electronic device and a power terminal of the portable electronic device and an accessory module constructed and arranged to electrically couple to the portable electronic device through least one terminal on a second portion of the terminal adapter to provide supplemental power to the portable electronic device. Examples of methods according to the present invention include mounting a terminal adapter comprising a positive contact and a negative contact, and a set of electrical terminals a battery of the portable electronic device.

In US Patent Application Publication no. 2017162735, whose disclosure is incorporated by reference, Hsu Hung-Ru et al. describe a solar cell structure for wireless charging includes a substrate and at least one thin film solar cell disposed on a surface of the substrate, wherein the thin film solar cell has a winding coil structure. Accordingly, in the thin film solar cell, the electrode which is the winding coil structure may be used as electromagnetic induction coil or millimeter-wave radio wave receiving radiator.

In viewing the prior art, there appears to be a number of unsolved, outstanding problems, including, but not limited to:

The need for a non-bulky, lightweight on-board charger having high mobility;
Ease of retrofitablity to an array of mobile devices;
Low cost and high effectiveness; and
Power management and buffering/storage of on-board charger-generated power for the mobile device There is therefore a need for a lightweight, low cost, and easily-retrofittable portable, wireless solar charger apparatus to significantly reduce or possibly eliminate the need for charging mobile device batteries using an off-board charger.

SUMMARY OF INVENTION

According to the teachings of the current invention, there is provided a retrofit wireless solar charger apparatus for a mobile device, the charger apparatus having an enclosure enclosing: a photovoltaic (PV) array having an efficiency of at least 22 percent, the PV array exposed to ambient light; a battery in electrical contact with the PV array; an RF power transfer coil in electrical contact with the battery; a printed circuit board (PCB) having a front side and a back side, the PCB having surface-mounted components mounted on the front side and the PCB being in electrical contact with the PV array, the battery, and the RF transfer coil; and a two-sided adhesive layer, the two-sided adhesive layer adhered to the back side of the PCB; wherein the charger apparatus has a thickness ranging from 1 to 3 mm and the charger apparatus is retrofittably-adhered on-board the mobile device. Preferably, the mobile device is at least one chosen from the list including: a smartphone; a tablet; a personal computer; and a smart watch, the mobile device having at least one rechargeable battery and a wireless charging receiving coil. Most preferably, the surface-mounted components are configured to control power management, communications, and user interface of the charger apparatus. Typically, the RF power transfer coil is configured to transfer power to and communications between the mobile device and the charger apparatus. Most typically, communications includes at least one chosen from the list including: Bluetooth; and NFC.

Preferably, the apparatus has a weight of at most 20 grams and the apparatus has a sticker configuration. Most preferably, the apparatus has a price ranging from $5 to $50. Typically, the user interface includes a series of interactive messages shown on a screen of the mobile device for operation of the charger apparatus.

According to the teachings of the current invention, there is further provided a method of retrofitting and operating a retrofit wireless solar charger apparatus for a mobile device, the charger apparatus having an enclosure, the method including the steps of: enclosing in an enclosure: a photovoltaic (PV) array having an efficiency of at least 22 percent, the PV array exposed to ambient light; a battery in electrical contact with the PV array; an RF power transfer coil in electrical contact with the battery; a printed circuit board (PCB) having a front side and a back side, the PCB having surface-mounted components mounted on the front side and the PCB being in electrical contact with and controlling the PV array, the battery, and the RF transfer coil; a two-sided adhesive layer, the two-sided adhesive layer adhered to the back side of the PCB; retrofittably adhering the charger apparatus ("sticker"), having a thickness ranging from 1 to 3 mm, on-board the mobile device; and using a user interface, which includes a series of user interactive messages shown on a screen of the mobile device, to operate the wireless solar charger apparatus. Preferably, the mobile device is at least one chosen from the list including: a smartphone; a tablet; a personal computer; and a smart watch, the mobile device having at least one rechargeable battery and a wireless charging receiving coil. Most preferably, the surface-mounted components control power management, communications, and user interface of the wireless solar charger apparatus. Typically, the RF power transfer coil serves to transfer power and communications between the mobile device and wireless solar charger apparatus. Most typically, the wireless solar charger apparatus weighs at most 20 grams and the apparatus has a sticker configuration.

Preferably, using a user interface includes the steps of: logging on and activating the sticker, using user logon information; evaluating logon information to ensure it is correct; displaying a status of the sticker, including: charging/not charging of the mobile device battery; sticker charge level; LED indicator on-off functionality; status and warning to adjust sticker position for charging; and evaluating and confirming sticker position for charging.

LIST OF FIGURES

Figure 1B:
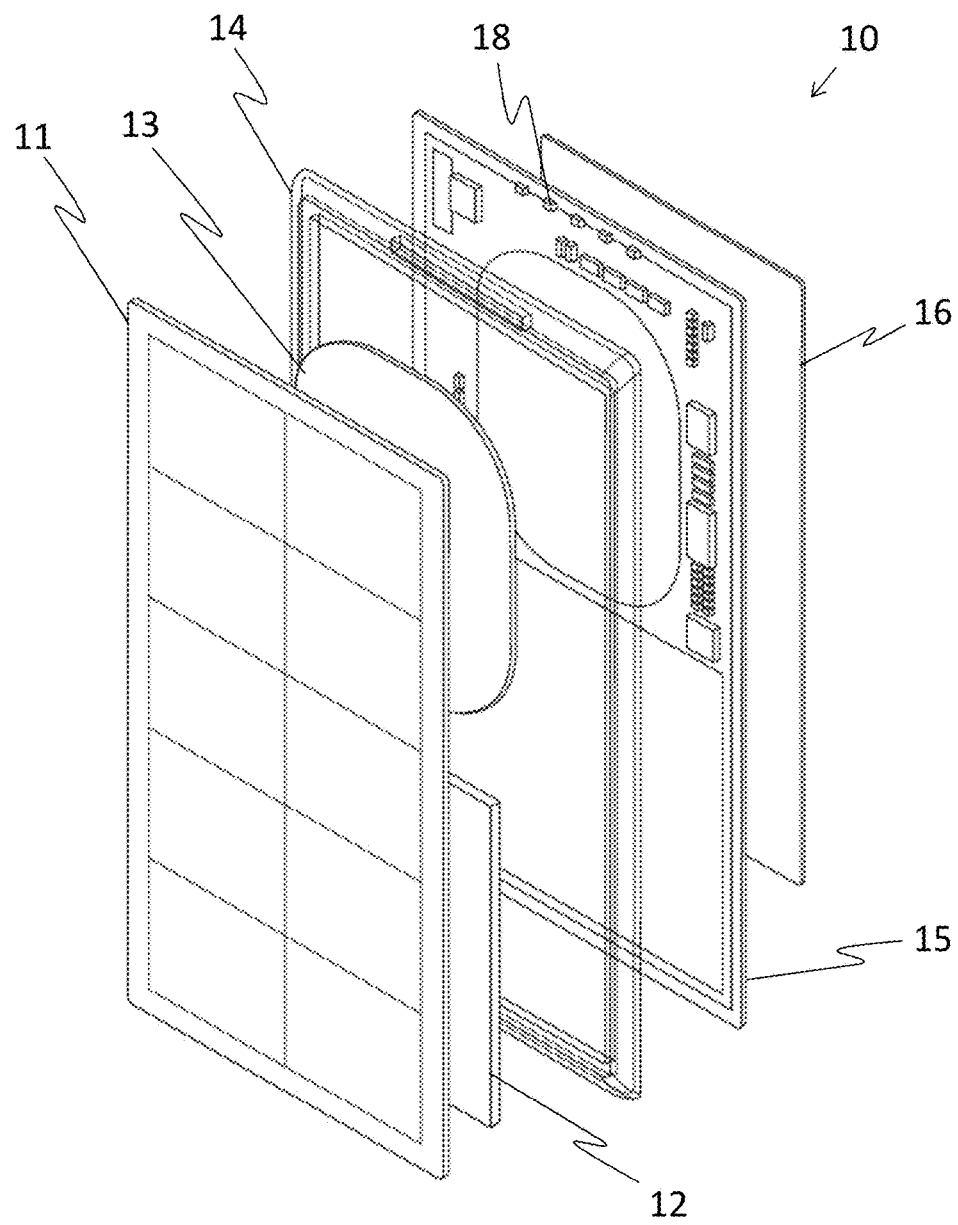
Figure 1C:
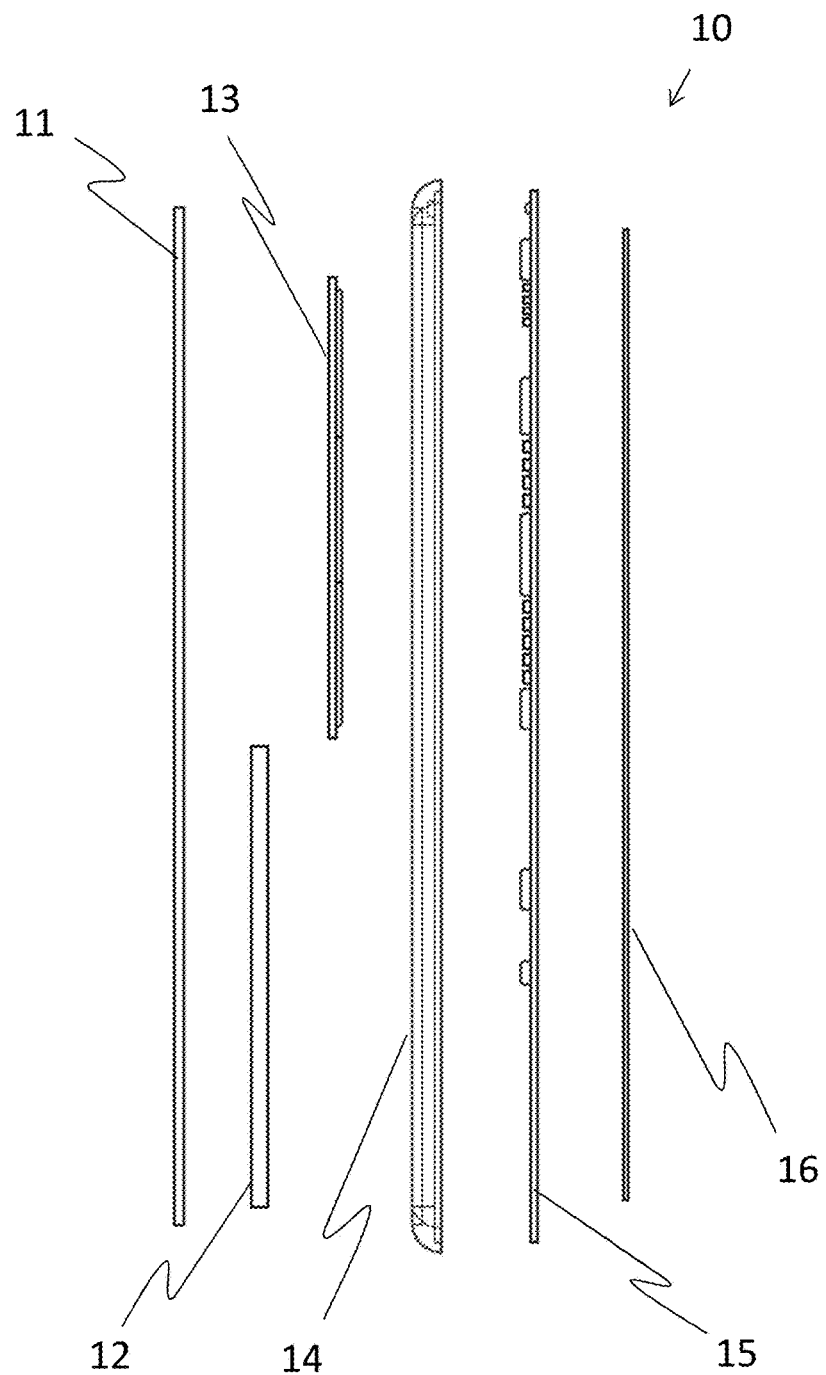
Figure 2:
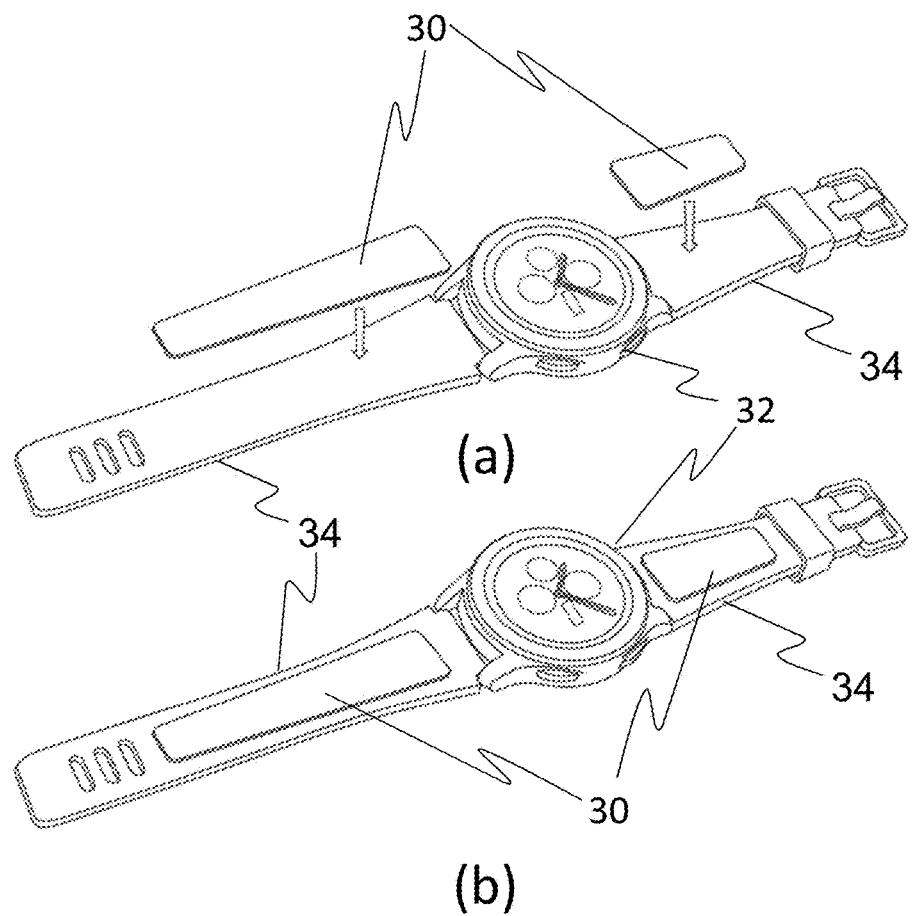
Figure 3:
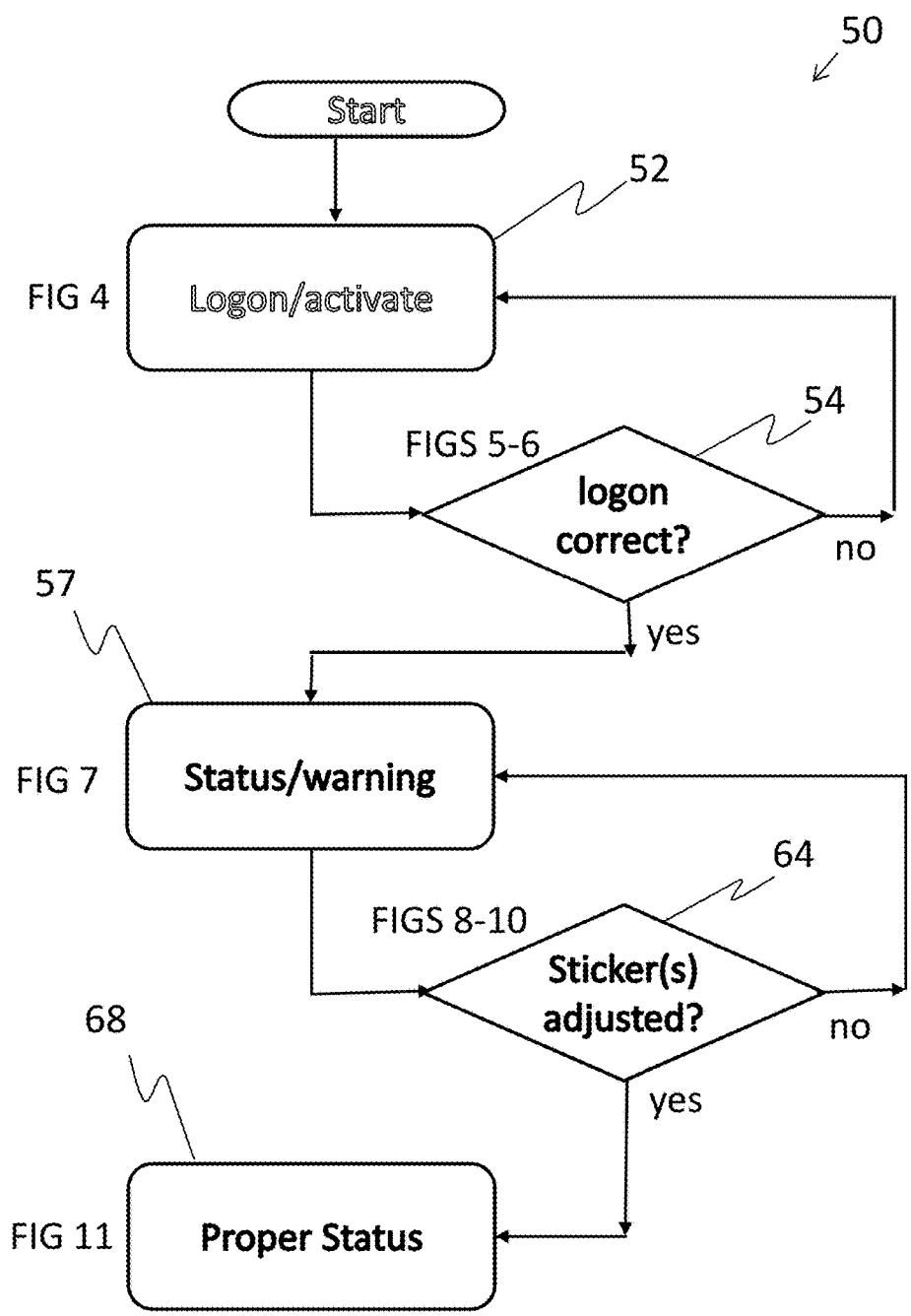
Figure 4:
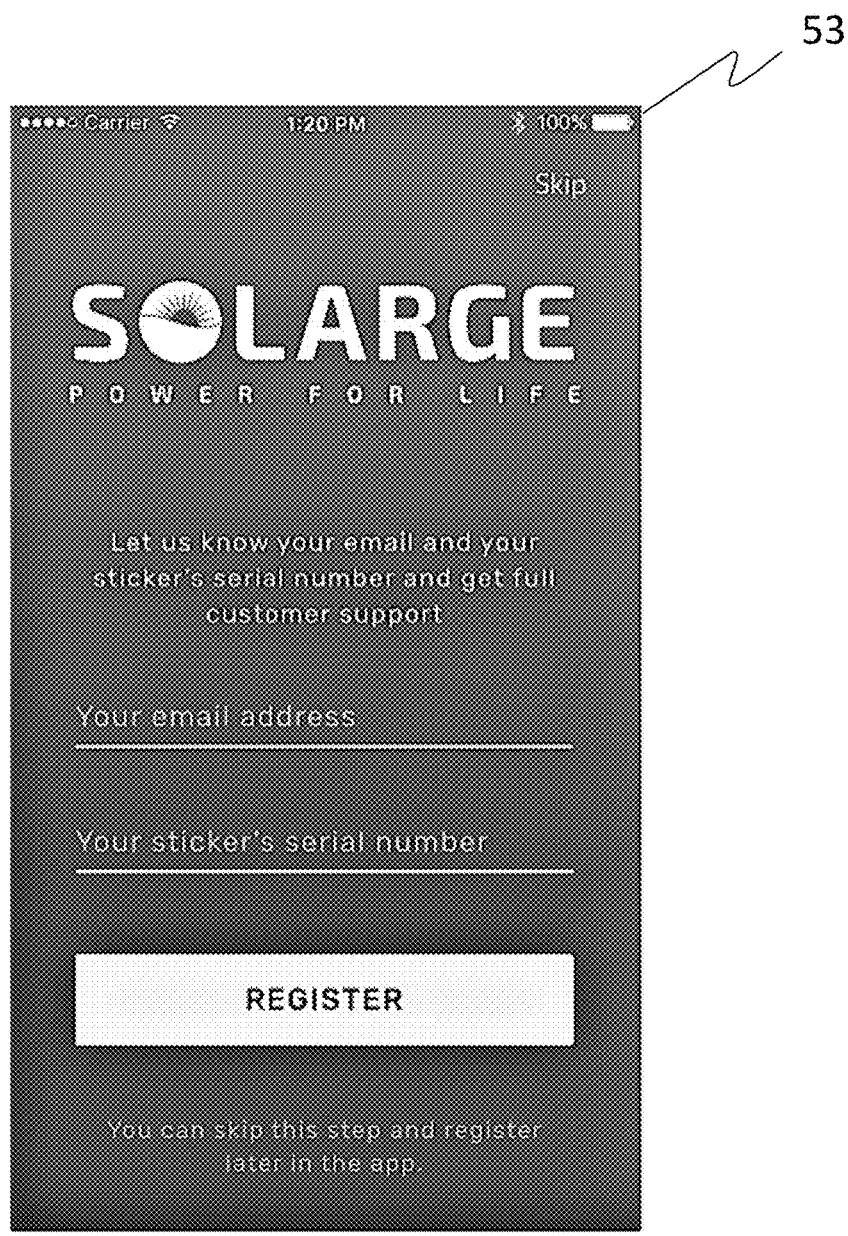
Figure 5:
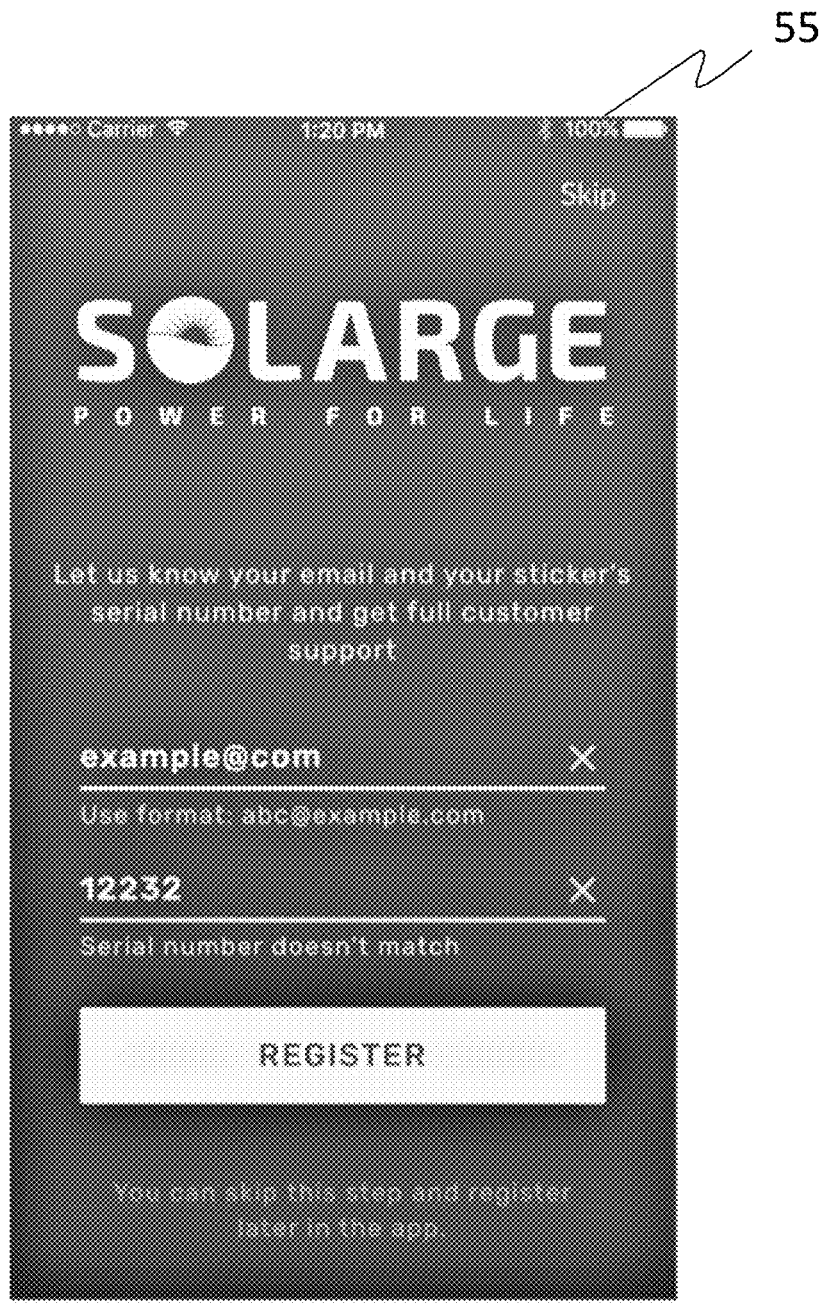
Figure 6:

The invention is herein described, by way of example only, with reference to the accompanying drawings, wherein:

FIGS. 1A-C are schematic and exploded views of a retrofit wireless solar charger apparatus, in accordance with embodiments of the current invention;

FIG. 2, has two schematic views of a smart watch retrofit wireless solar charger, in accordance with an embodiment of the current invention;

FIG. 3 is a flowchart showing the steps of operating the retrofit wireless solar charger, in accordance with embodiments of the current invention; and FIGS. 4-11 are a series of smartphone screen messages, according to the flowchart shown in FIG. 3 and in accordance with embodiments of the current invention.

DETAILED DESCRIPTION

Embodiments of the present invention provide for a mobile device having rechargeable batteries, and specifically to a retrofit wireless solar charger apparatus and methods to significantly reduce the need for battery recharging using an off-board charger.

Reference is currently made to FIGS. 1A-C, are schematic and exploded views of a retrofit wireless solar charger apparatus 10, in accordance with embodiments of the current invention. Retrofit wireless solar charger apparatus 10 includes: a solar cell array 11; a battery 12; an RF power transfer coil 13; an enclosure 14; a printed circuit board (PCB) 15; and a two-sided adhesive layer 16. In the specification and claims which follow hereinbelow, the terms "solar cell array" and "photovoltaic array" are used interchangeably, are intended to have equivalent meaning, and are substituted by the expression "PV array".

LED indicators 18 (visible in FIG. 1A (a) and in FIG. 1B) are mounted onto PCB 15 and serve to indicate functionality/status of the retrofit wireless solar charger apparatus, as described further hereinbelow.

The retrofit wireless solar charger apparatus described hereinbelow is adapted for use with an exemplary smartphone (not shown in the figures) having a representative rectangular shape having an approximate aspect ratio of 1:2 (width/height) and having an internal battery capacity ranging from 2,500 to 3,500 mAh—as known in the art. Retrofit wireless solar charge apparatus 10 is designed to be adhered the back of the exemplary smartphone and has approximate dimensions (width and length) the same as or less than that of a typical smartphone.

As is discussed further hereinbelow, embodiments of the retrofit wireless solar charger apparatus include adaptations to other mobile devices. The thickness of retrofit wireless solar charge apparatus 10, indicated as "t" in FIG. 1A (b), ranges from 1.0 to 3.0 mm.

Solar cell array 11 is a photovoltaic (PV) cell having an approximate efficiency of at least 22% and typically in the range of 22%-24%, as known in the art and provides an exemplary output of at least 1,000 mW when the solar cell array is exposed to typical ambient light. One example of a suitable PV cell is that manufactured by: Shenzhen Desun Energy Technology CO., ltd, 2F/3F BuildingB/C, HuaZe High-tech industrial, No. 108 Zhou Shi Road, ShiYan town, Bao'an District, Shenzhen, China. Another example of a more efficient PV cell, having an efficiency in excess of 30% (thereby capable of providing a higher power output) is that manufactured by SPECTROLAB, INC, 12500 Gladstone Avenue, Sylmar, Calif. 91342 USA.

Battery 12 has an exemplary capacity ranging from 500 mAh to 3,000 mAh and has a thin profile, compatible with thickness "t" of the retrofit wireless solar charge apparatus. A battery having an appropriate capacity and thickness as noted hereinabove is that produced by Power Stream Inc. 1163 South 1680 West, Orem Utah 84058.

RF power transfer coil 13 has a thin profile, the RF power transfer coil functioning to transfer power to and communications between the mobile device and retrofit wireless solar charge apparatus 10, as known in the art.

PCB 15 has a front and back side, with surface-mounted components mounted onto the front side, the PCB and its components serving to electrically connect the PV array, battery 12, and RF power transfer coil 13 and to manage and control retrofit wireless solar charge apparatus functionality, such as, but not limited to: power management, communications, and user interface. Among the communications functionalities are, but not limited to: Bluetooth and NFC. PCB 15 has a thin profile, compatible with and allowing it to fit within thickness "t" of the retrofit wireless solar charge apparatus.

Enclosure 14 serves to enclose and protect lateral edges of the solar cell array, the on-board battery; the RF power transfer coil, and the PCB. Two-sided adhesive layer 16 is adhered to the back side of the PCB and the dimension (width/length) of the two-sided adhesive layer are the same or less than those of the PCB. Two-sided adhesive layer 16 has a thin profile, compatible with the overall thickness "t" of the retrofit wireless solar charge apparatus. The two-sided adhesive layer is any thin layer of material capable of maintaining the retrofit wireless solar charger apparatus in intimate proximity to the mobile device's wireless charging power antenna (not shown in the figures). Whereas one side of the two-sided adhesive layer is adhered to the back of the PCB board, the second side of the two-sided adhesive layer is adhered only after the user adjusts the position of the retrofit wireless solar charge apparatus with regard to the mobile device, as described further hereinbelow. An exemplary two-sided adhesive layer can include conventionally available products, typically having a removable film to expose respective adhesive layers, or, alternatively, a thin-profile hook-and-pile product, as known in the art.

Once retrofit wireless solar charger apparatus 10 is adhered to the mobile device, as described further hereinbelow, when the solar cell array is exposed to incident light, the array generates electricity, which is managed by the PCB components to provide power to battery 12. Battery 12 is similarly managed to provide electrical energy wirelessly through the RF power transfer coil to a receiving coil located on the mobile device designed to receive the charge. An embodiment of the current invention has a solar cell array capable of providing a 1,000-mW to the mobile device, so that in one hour approximately 25-50% of the capacity of a typical smart phone battery is charged.

In another embodiment of the current invention, battery 12 has a rapid charge or "flash" charge characteristic, enabling complete charging in much less than one hour (usually within only a few minutes). In the case when battery 12 is a "flash battery", the mobile device is charged significantly more quickly by the retrofit wireless solar charger apparatus and charging time of the mobile device is essentially limited by the characteristics of the mobile device and its battery—and not by the retrofit wireless solar charger apparatus. An example of such a "flash battery" is that manufactured by StoreDot Ltd. I 3 Shenkar St. Herzeliya I Israel 4672503.

As noted previously herein above, although the retrofit wireless solar charger shown in FIGS. 1A-1C and described hereinabove has an aspect ratio and size characteristic/applicable to a smart phone, other configurations and sizes of the retrofit wireless solar charger are applicable to other mobile devices, mutatis mutandis.

Additionally, because the retrofit wireless solar charger apparatus has a very thin profile and has a weight of 20 grams or less (depending on the mobile device to be used), the term "sticker" is used hereinbelow in in the claims to typify the thin profile and lightweight configuration of the retrofit wireless solar charger apparatus and in the specification and claims which follow, "sticker" is intended to have interchangeable meaning with "retrofit wireless solar charger apparatus". The sticker is priced to be in the range of $5 to $50, by using low-cost components and mass production. Combining low cost, a light and thin profile, and easy application, the sticker is easily retrofittable to mobile devices.

Reference is currently made to FIG. 2, which has two schematic views of a retrofit wireless solar charger apparatus 30 adapted to a smartwatch 32, in accordance with an embodiment of the current invention. Apart from differences described below, retrofit wireless solar charger apparatus 30 is identical in notation, configuration, and functionality to that shown in FIGS. 1A-1C hereinabove.

Smartwatch 32 has watch straps 34, as shown. As can be seen in views (a) and (b), retrofit wireless solar charger apparatus 30 is adhered to straps 34 of smartwatch 32 in a manner similar to that described hereinabove with regard to retrofit wireless solar charger apparatus 10, mutatis mutandis. An RF antenna and an electrical connection between the two parts of retrofit wireless solar charger apparatus 30 are not shown in the figures—however it is understood that retrofit wireless solar charger apparatus 30 has a structure/configuration enabling it to transfer power to the smartwatch in a manner similar to that described hereinabove with regard to retrofit wireless solar charger apparatus 10, mutatis mutandis.

Reference is currently made to FIG. 3, which is a flowchart 50 showing the steps of a user interface to operate the retrofit wireless solar charger apparatus, in accordance with embodiments of the current invention. Additionally, reference is currently made to FIGS. 4-11, which are a series of interactive screen messages, according to the flowchart shown in FIG. 3 and in accordance with embodiments of the current invention. As noted hereinabove and in FIGS. 4-11, the term "sticker" is intended to mean the retrofit wireless solar charger apparatus.

The retrofit wireless solar charger apparatus is supplied with a previously-charged on-board battery, so that when the apparatus is initially readied for use, to be placed onto the mobile device, Bluetooth communication between the retrofit wireless solar charger apparatus and the mobile device is enabled, and a series of user interface messages appear on the mobile device screen, as described hereinbelow. The user is then directed to login/activate, obtain status messages, and adjust the "sticker", as described hereinbelow, with regard to FIG. 3 and FIGS. 4-11.

Step 52, Login/activate (ref FIG. 4) is an initial user interface screen 53. The user is prompted to enter his exemplary credentials (such as, but no limited to: email address and serial number of the sticker) and to push REGISTER to proceed. Note that the user may proceed without registering at the initial step, however further functionality retrofit wireless solar charger apparatus may be limited until the user registers. "Register", "login", and "logon" are used interchangeably hereinbelow and in the figures. Once the user pushes REGISTER, step 54 logon correct? evaluates if the logon information for the user is correct. A non-matching serial number interface screen 55 (ref FIG. 5) shows an unsuccessful attempt to register—and control is reverted back to Step 52, Login/activate.

Figure 7:
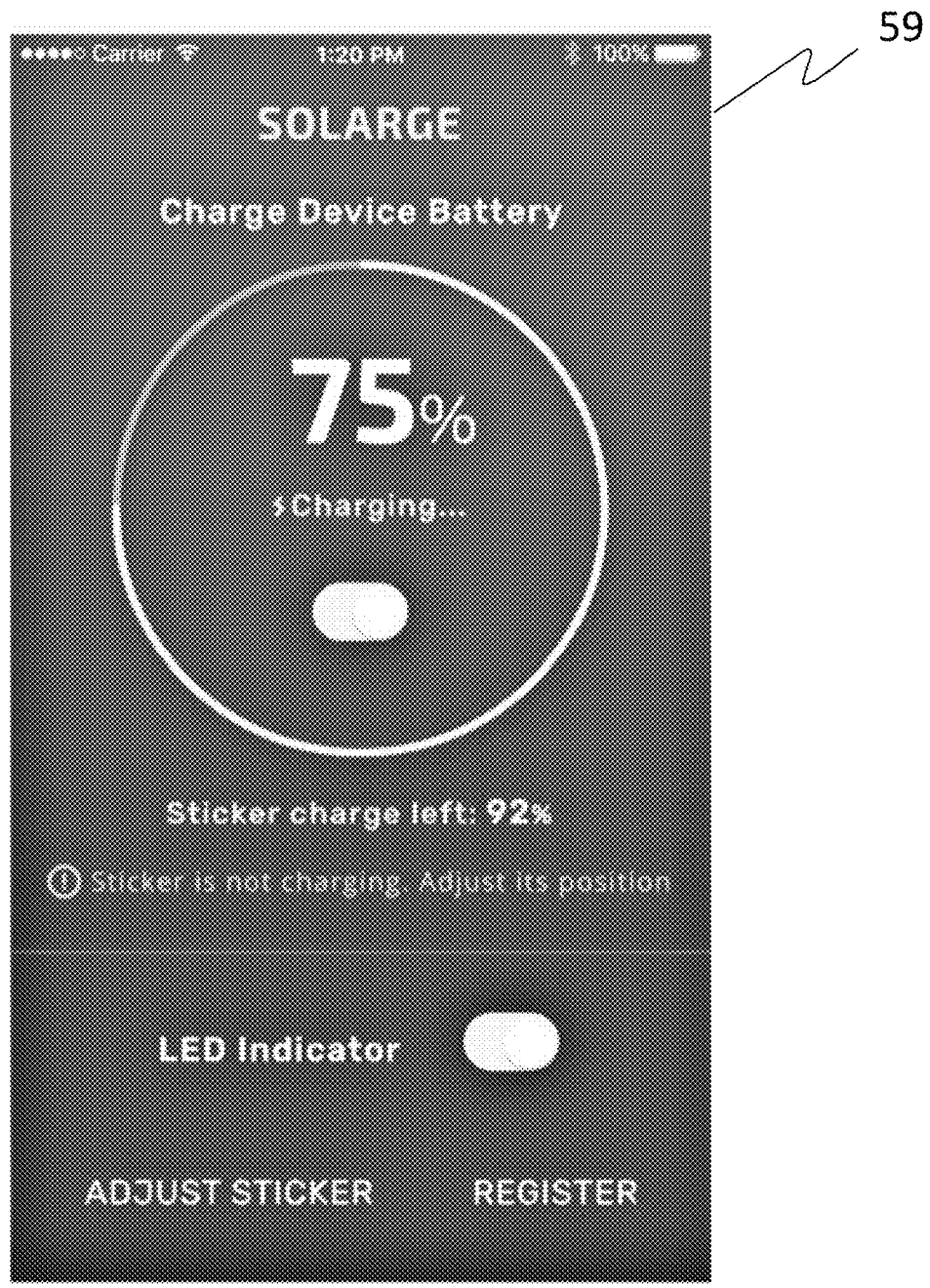

A correct serial number interface screen 58 (ref FIG. 6) shows a successful attempt to register—and control is advanced to the next step, Step 57, Status/warning and a status/warning user interface screen 59 (ref FIG. 7).

In the current step, the status of the sticker is displayed, namely:
Charging/not charging of mobile device battery
Charge level of the sticker battery ("sticker charge")
LED indicator on-off functionality (LED indicator functionality includes, but is not limited to: lighting when the mobile device is charging, and indication of a sticker fault.)

As can be seen in status/warning user interface screen 59, the sticker is not charging, and the user is prompted to adjust the position of the sticker with regard to the mobile device. This is typically performed by the user holding the sticker with the double-sided adhesive side of the sticker towards the back side of the device and adjusting the sticker's position until the user interface indicates the position is correct. In Step 64 Sticker(s) adjusted? such a check is made. If the position is not correct, control is reverted to step 57 and the user is prompted to reposition the sticker.

Figure 8:
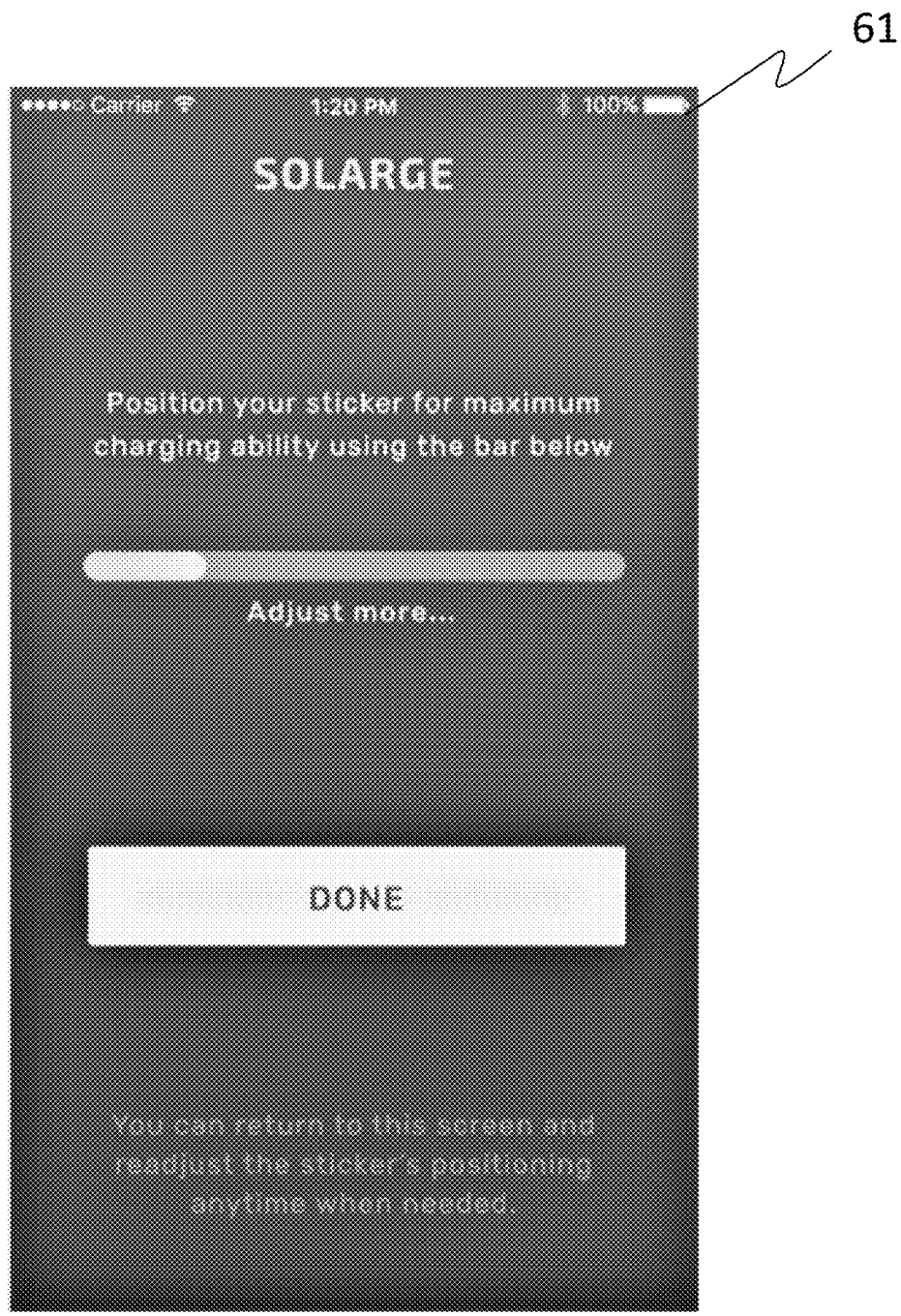
Figure 9:
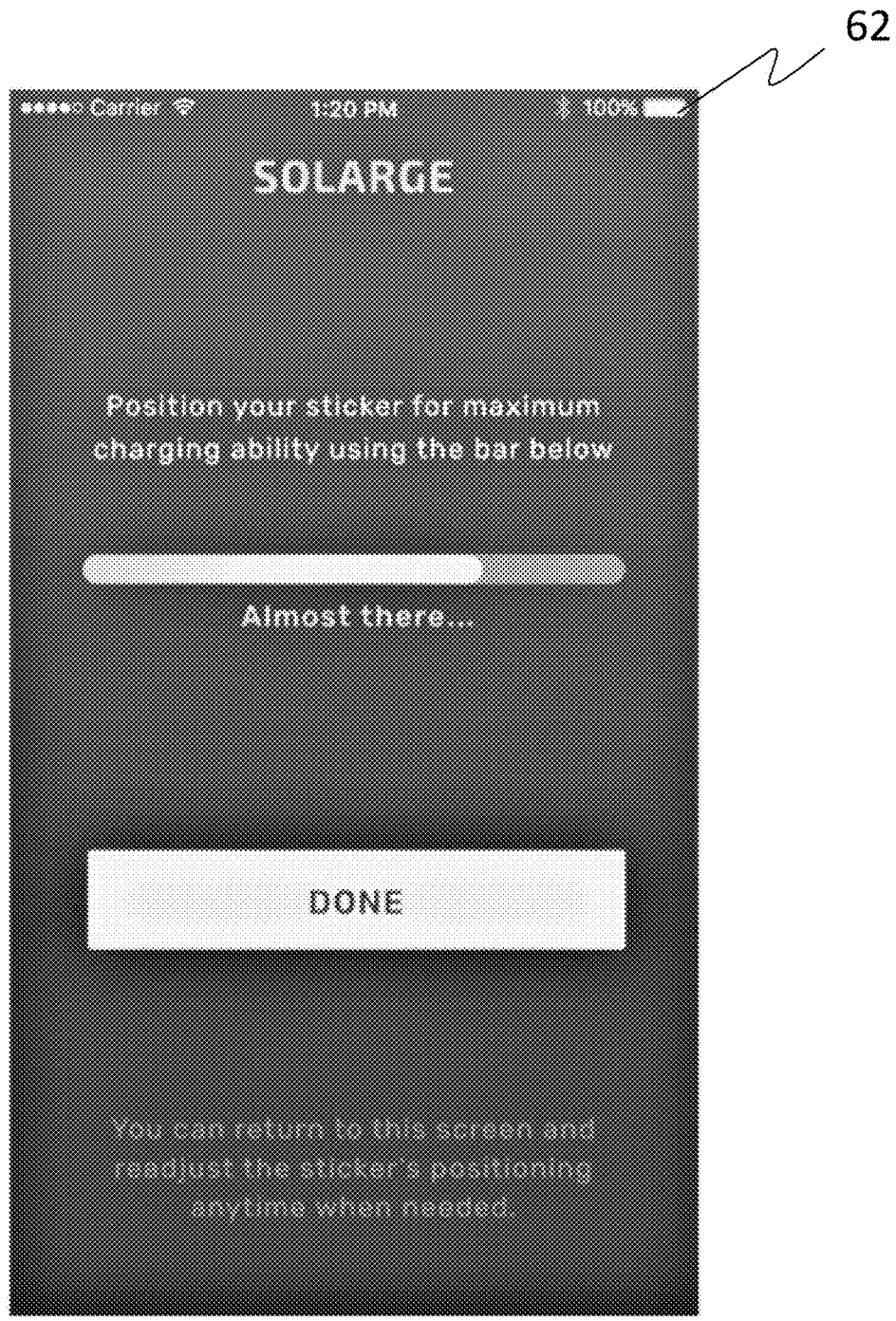
Figure 10:
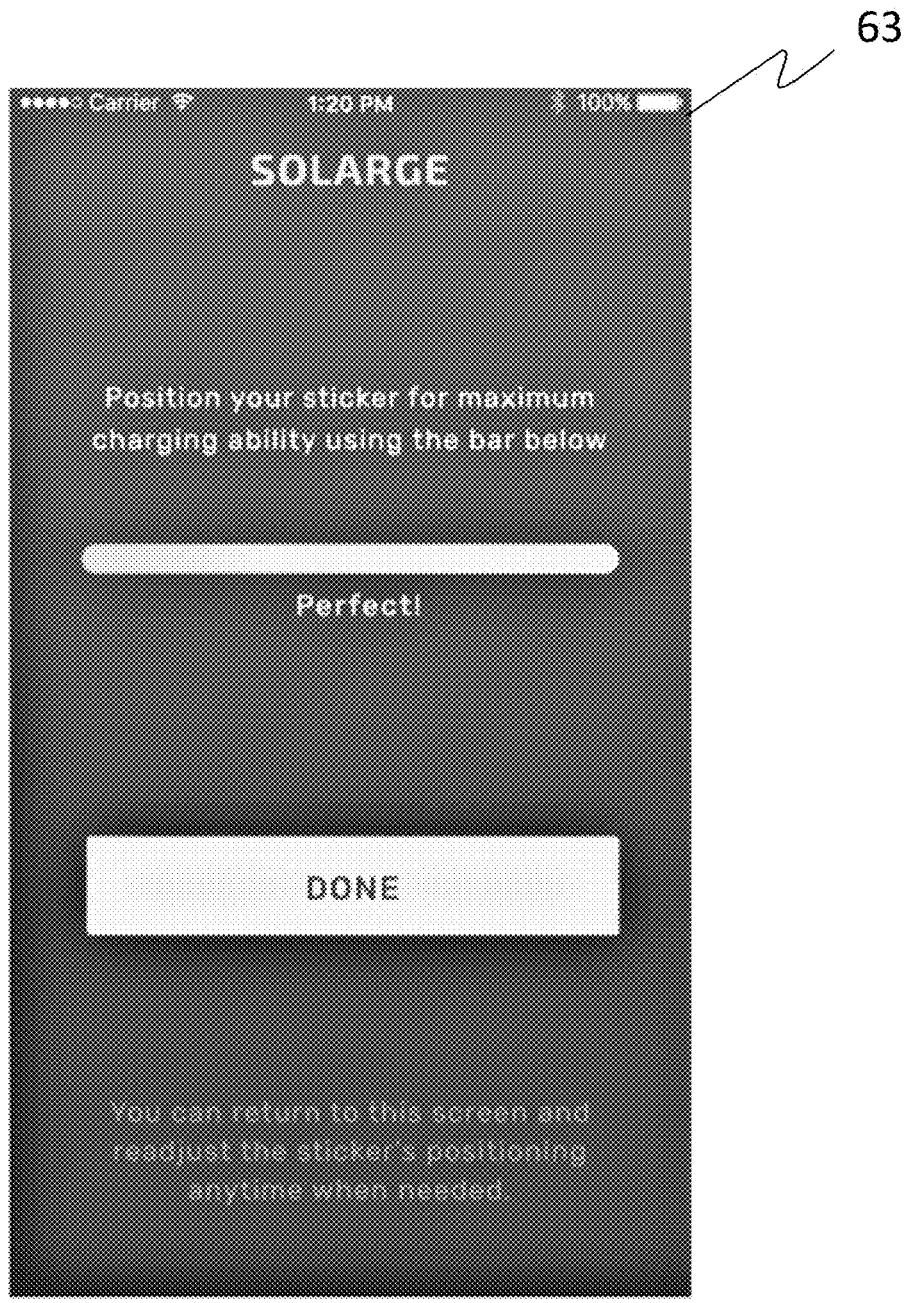
Figure 11:
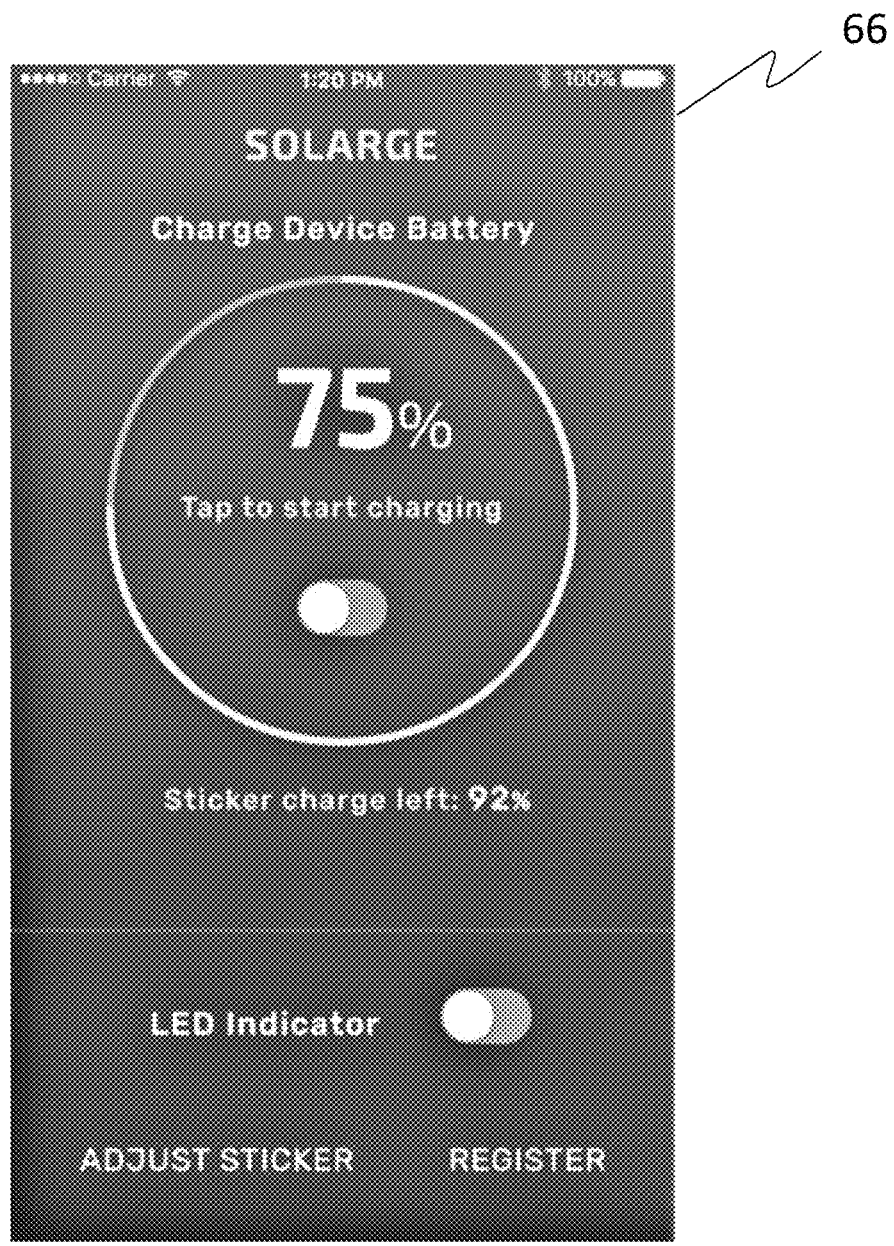

FIGS. 8-10 show positioning user interface screens 61, 62, and 63—with positioning user interface screen 63 (FIG. 10) indicating correct positioning. The user pushes DONE and control is advance to step 68 Proper Status, indicated by user interface proper status screen 66 (ref FIG. 11). Once the position is confirmed as correct, the user activates the second side of the two-sided adhesive layer to adhere the sticker onto the mobile device.

Whereas the format of the screen messages shown in FIGS. 4-11 is representative of the format of a smartphone and/or tablet, it is to be understood that embodiments of the current invention include similar messages, which can be adapted to respective formats of other mobile devices, mutatis mutandis. Alternatively or optionally—especially in the case of a smartwatch—screen messages may be displayed on the connected device (usually a smartphone), guiding the smartwatch user, as is known in the art.

It will be appreciated that the above descriptions are intended only to serve as examples, and that many other embodiments are possible within the scope of the present invention as defined in the appended claims.

The invention claimed is:

1. A retrofit wireless solar charger apparatus for a mobile device, the charger apparatus having an enclosure enclosing:
   a photovoltaic (PV) array having an efficiency of at least 22 percent, the PV array exposed to ambient light;
   a battery having a first thin profile, the battery being in electrical contact with the PV array;
   an RF power transfer coil having a second thin-profile, the transfer coil being in electrical contact with the battery;
   a printed circuit board (PCB) having a third thin profile, the PCB having a front side and a back side, the PCB having surface-mounted components mounted on the front side and the PCB being in electrical contact with the PV array, the battery, and the RF transfer coil; and
   a two-sided adhesive layer having a fourth thin profile, the two-sided adhesive layer adhered to the back side of the PCB;
   wherein the charger apparatus comprises a sticker configuration having thickness ranging from 1 to 3 mm and a weight of 20 grams or less, the sticker being retrofittably-adhered on-board the mobile device.

2. The apparatus of claim 1, wherein the mobile device is at least one chosen from the list including: a smartphone; a tablet; a personal computer; and a smart watch, the mobile device having at least one rechargeable battery and a wireless charging receiving coil.

3. The apparatus of claim 1, wherein the surface-mounted components are configured to control power management, communications, and user interface of the sticker.

4. The apparatus of claim 3, wherein the RF power transfer coil is configured to transfer power to and communications between the mobile device and the sticker.

5. The apparatus of claim 4, wherein communications include at least one chosen from the list including: Bluetooth; and Near Field Communication (NFC).

6. The apparatus of claim 3, wherein the user interface includes a series of interactive messages shown on a screen of the mobile device for operation of the sticker.

7. A method of retrofitting and operating a retrofit wireless solar charger apparatus for a mobile device, the charger apparatus having an enclosure, the method including the steps of:
   enclosing in an enclosure:
      a photovoltaic (PV) array having an efficiency of at least 22 percent, the PV array exposed to ambient light;
      a battery having a first thin profile and being in electrical contact with the PV array;
      an RF power transfer coil having a second thin profile and being in electrical contact with the battery;
      a printed circuit board (PCB) having a third thin profile, the PCB having a front side and a back side, the PCB having surface-mounted components mounted on the front side and the PCB being in electrical contact with and controlling the PV array, the battery, and the RF transfer coil;
      a two-sided adhesive layer having a fourth thin profile, the two-sided adhesive layer adhered to the back side of the PCB;
      wherein the charger apparatus comprises a sticker configuration, the sticker having a thickness ranging from 1 to 3 mm and a weight of 20 grams or less,
   retrofittably adhering the sticker on-board the mobile device; and
   using a user interface, which includes a series of user interactive messages shown on a screen of the mobile device; to operate the wireless solar charger apparatus.

8. The method according to claim 7, whereby the mobile device is at least one chosen from the list including: a smartphone; a tablet; a personal computer; and a smart watch, the mobile device having at least one rechargeable battery and a wireless charging receiving coil.

9. The method according to claim 8, whereby the surface-mounted components control power management, communications, and user interface of the sticker.

10. The method according to claim 9, whereby the RF power transfer coil serves to transfer power and communications between the mobile device and sticker.

11. The method according to claim 9, whereby using a user interface includes the steps of:
   logging on and activating the sticker, using user logon information;
   evaluating logon information to ensure the logon information is correct;
   displaying a status of the sticker, including:
      charging/not charging of the mobile device battery;
      sticker charge level;
      LED indicator on-off functionality;
      status and warning to adjust sticker position for charging; and
   evaluating and confirming sticker position for charging.

* * * * *